United States Patent [19]

Bishop et al.

[11] Patent Number: 5,656,941

[45] Date of Patent: Aug. 12, 1997

[54] TAB TAPE-BASED BARE CHIP TEST AND BURN-IN CARRIER

[76] Inventors: Thomas Alan Bishop, 7444 Dallas Dr., Austin, Tex. 78729; Ernest Ricky Nolan, 1204 Robin Trail, Round Rock, Tex. 78681

[21] Appl. No.: 388,641

[22] Filed: Feb. 14, 1995

[51] Int. Cl.⁶ ........................................... G01R 1/04
[52] U.S. Cl. ............................................. 324/754
[58] Field of Search ........................... 324/754, 751; 361/386

[56] References Cited

U.S. PATENT DOCUMENTS 3,613,001  10/1971  Hostetter ........................ 324/754
5,162,975  11/1992  Matta et al. ..................... 361/386
5,262,925  11/1993  Matta et al. ..................... 361/783

Primary Examiner—Kenneth A. Wieder
Assistant Examiner—Barry C. Bowser

[57] ABSTRACT

TAB tape is used to contact integrated circuit chip electrodes (without actual metallurgical bonding) at approximately 10 grams per lead contact force. The chip is clamped to the TAB leads, and held in place so that the tape site can be transported, tested, and burned-in like a TAB chip on tape. A TAB tape frame is utilized with the inner lead bond fingers angled upwards so that the ends of the fingers perform a scrubbing action on the chip contacts when the IC chip is engaged with the TAB tape slide carrier socket. A silicone bead provides a spring-like action underneath the fingers.

15 Claims, 4 Drawing Sheets

TAB TAPE-BASED BARE CHIP TEST AND BURN-IN CARRIER

TECHNICAL FIELD OF THE INVENTION

The present invention relates in general to testing and burn-in of integrated circuit chips, and in particular, to a method and apparatus for facilitating high-speed testing and dynamic burn-in of single bare integrated circuit chips.

BACKGROUND OF THE INVENTION

The success of nearly every multichip electronic system depends on the availability of functional, reliable integrated circuit ("IC") chips. As chip counts in a multichip system increase, this dependency is critical. In most cases, "known good die" ("CKGD") are not readily available in an unpackaged form. The definition of KGD is a bare die that has the performance and warranty from the supplier of a conventionally packaged and tested die.

Most manufacturers of multichip electronic modules ("MCM") require high yield and reliable IC chips to avoid low yields and reliability at the assembly level. High chip yield translates into an availability to full speed test ("FST") and burn-in ("B/I") singular, bare ICs before they are committed to an electronic assembly. Many IC's have potential defects which can only be detected when the chip is operating at speeds (clock speeds and input/output speeds) similar to that of actual use. Full speed testing under these conditions requires more sophisticated testing equipment and connection techniques compared to conventional wafer probing technology. "Burn-in" refers to the testing of an item in a process in order to stabilize that item's characteristics. FST and B/I are advantageous when IC yields are low, and/or when conventional type IC testing is an inadequate screen for faulty ICs. Conventional IC probing has consisted merely of DC (direct current) probing which cannot fully test an IC being prepared for assembly technology such as flip-chip and wire-bonding. (A "flip-chip" is a semiconductor chip with thickened and extended bonding pads enabling it to be flipped over and mounted upside down on a suitable substrate. "Wire bonding" is a method used during the packaging of ICs to connect the chip to the leadframe.) Furthermore, wire probe technologies can only test chips fabricated with a $\geq 6$ mil pitch. Membrane probe technologies provide a partial answer to IC FST at the wafer level, however, membrane probes cannot perform IC burn-in. Also, membrane probes do not address warranting the bare IC device when being shipped from the IC vendor to the end assembly house. Even with packaged IC devices, considerable precautions are taken to prevent damage to the device between the time it is tested and the time the customer assembles it into a system. These precautions include conductive foam and shielded bags to prevent electrostatic discharge damage, packaging to prevent mechanical damage, etc. With bare IC's the problems are compounded.

Users that benefit from an ability to perform FST and B/I on singular, bare ICs are mostly electronic systems manufacturers with relatively little vertical integration, who are involved in advanced packaging (MCM) efforts. In most cases, these users' current bare-chip usage is not sufficient to influence their chip suppliers to perform additional processes. Furthermore, they are often unable to procure their chips in whole wafer form, because their supplier considers wafer yields to be proprietary information.

As a result of the foregoing, there is a need for a technique suitable for single chip dynamic burn-in and high speed testing (including elevated temperature testing), which is implementable by a bare die user with existing commercial technology and is compatible with low-to-medium volume production. Non-recurring engineering and tooling costs should be kept as low as possible.

SUMMARY OF THE INVENTION

The present invention satisfies the foregoing need by providing for a single chip test and burn-in carrier, which can be used by a bare die user to selectively screen chips prior to MCM assembly. This carrier provides compatibility with commercially available TAB (tape automated bonding) test and burn-in sockets, and requires no special processing of the chip.

The technique disclosed herein employs a novel use of specially constructed TAB tape as a non-destructive and temporary means of electrically contacting bare die for full speed test, burn-in and handling/shipping. TAB is a method used during the packaging of ICs, usually when a large number of interconnections (over 100) is required between the chip and the leadframe. The leadframe is formed from plated copper on a strip of plastic (the tape), and extends to reach the bonding pads of the chip. No special processing of the IC is required either before or after testing is completed, and the IC contacting method is compatible with all current bare IC metallurgies. Furthermore, TAB technology allows for testing of chips fabricated with a fine pitch technology ($\leq 3$ mil pitch).

IC test pad scrub and metal oxide penetration is required for most non-gold die pad metalizations in order to achieve adequate electrical performance for FST and B/I. Special forming (bending upwards) of the TAB tape frame produces die pad scrubbing during IC insertion for excellent and repeatable electrical contact to the IC device. An elastomeric underfill for the uniquely formed TAB tape allows the TAB tape frame to return to its original shape after each IC insertion and removal for multiple uses from one tape frame.

Furthermore, in a preferred embodiment of the present invention, when special TAB tape is used in conjunction with a temporary die retention clip or retention adhesive and TAB tape carrier, the manufacturer or supplier can transport the IC from FST to B/I to module assembly without exposing the die to handling operations. The TAB tape can be utilized as the socket carrier itself, or the bent leads can be excised and bonded into a single chip package, i.e., PGA, dip, etc. This special socketing approach resembles conventional TAB parts after inner lead bonding ("ILB"), but before leadform and/or conventional single chip packages, and can therefore utilize existing FST and B/I sockets and handling capabilities compatible with TAB or single chip packages.

The aforementioned IC socketing method provides a robust means for transport of an IC from the IC vendor to end user. The present invention provides a means to connect to the bare IC terminals, allowing them to be shorted together (electrostatic protection) and also provides mechanical protection. Upon receipt, the customer can easily connect to the device for quality verification. Also, since the IC can be tested inside the sealed socket, the end user can test the device to satisfaction before breaking the warranty seal on the socket.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
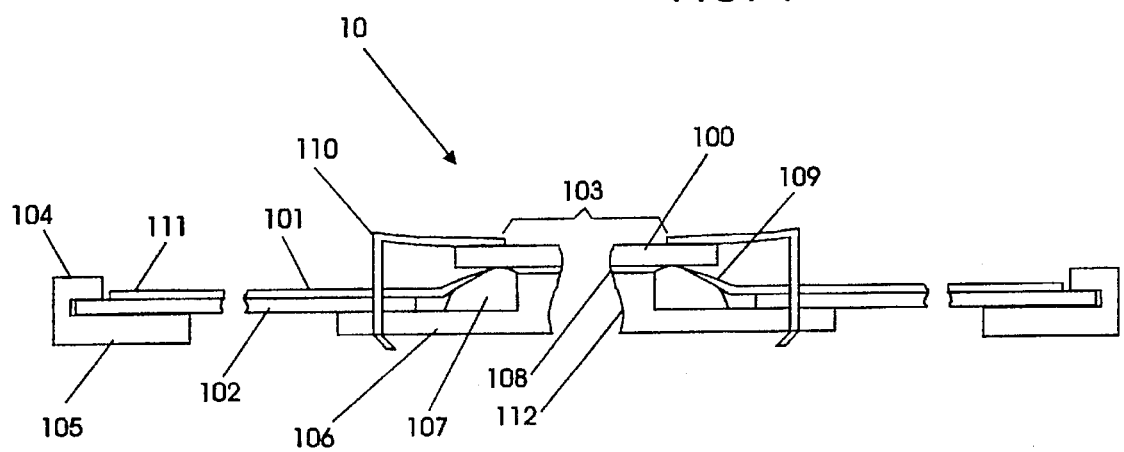
FIG. 1 illustrates a side sectional view of a preferred embodiment of the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Refer now to the drawings wherein depicted elements are not necessarily shown to scale and wherein like or similar elements are designated by the same reference numeral through the several views.

Referring to FIG. 1, there is illustrated a sectional side view of TAB-based carrier 10 in accordance with a preferred embodiment of the present invention.

Figure 4:
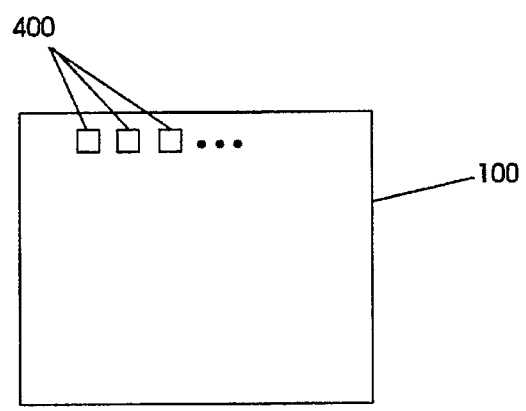
FIG. 4 illustrates a bottom view of the die under test.

Referring to FIG. 4, there is illustrated a bottom view of die 100 shown in FIG. 1. Die 100 under test may be any typical integrated circuit chip having contact pads 400 underneath for providing coupling of the internal integrated circuitry to the outside world. Contact pads 400 may be located all around the circumference of the bottom of die 100, and may be 0.003 to 0.008 inches square. There may be anywhere from approximately 16 to 500 contact pads 400 on die 100. Such dies, or chips, are well-known in the art and may be rectangular chips (for example, for memory and analog-to-digital converters) or square chips (for example, for gate arrays).

Figure 2:
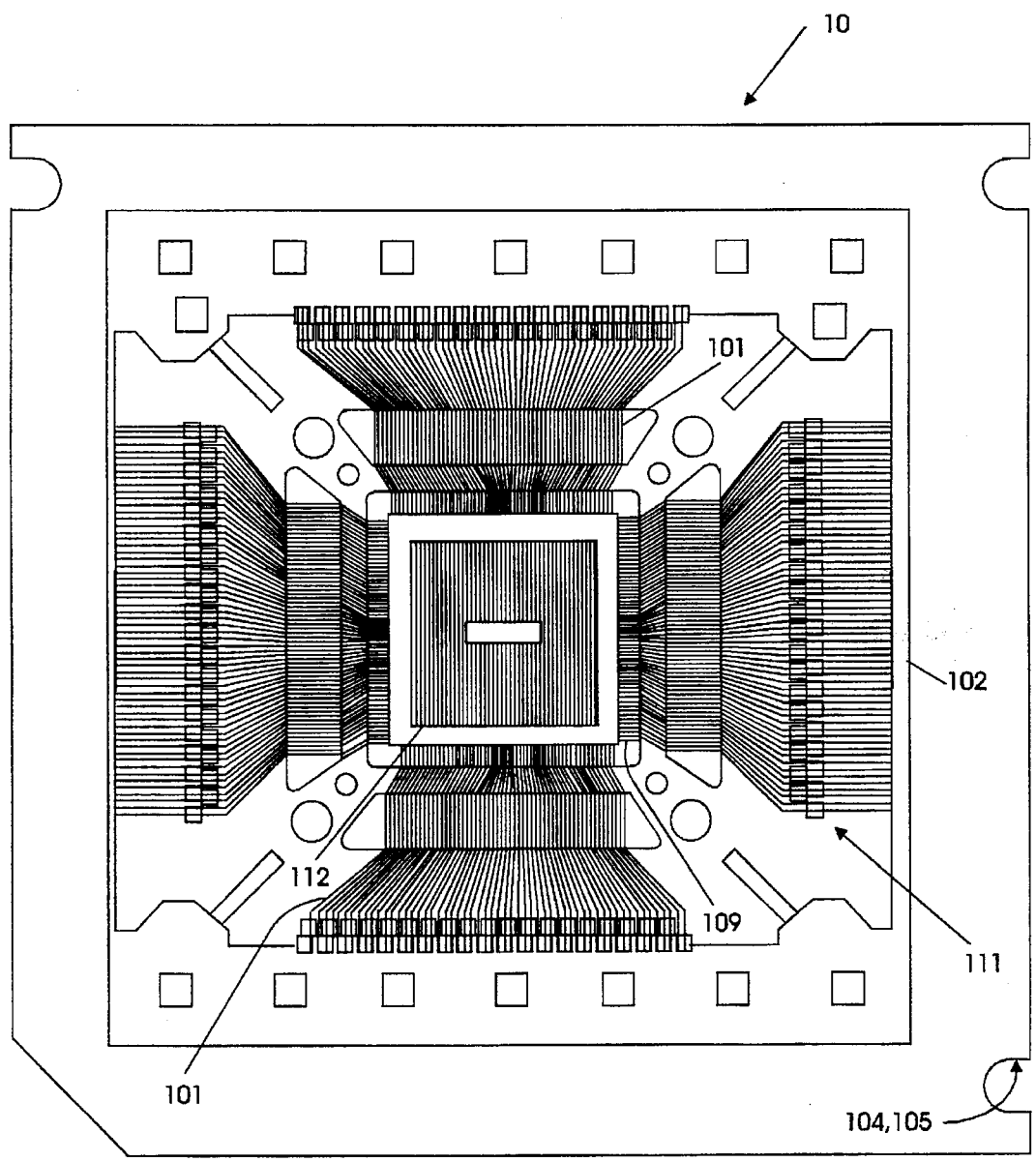
FIG. 2 illustrates a top view of a preferred embodiment of the present invention without a die under test inserted.
Figure 3:
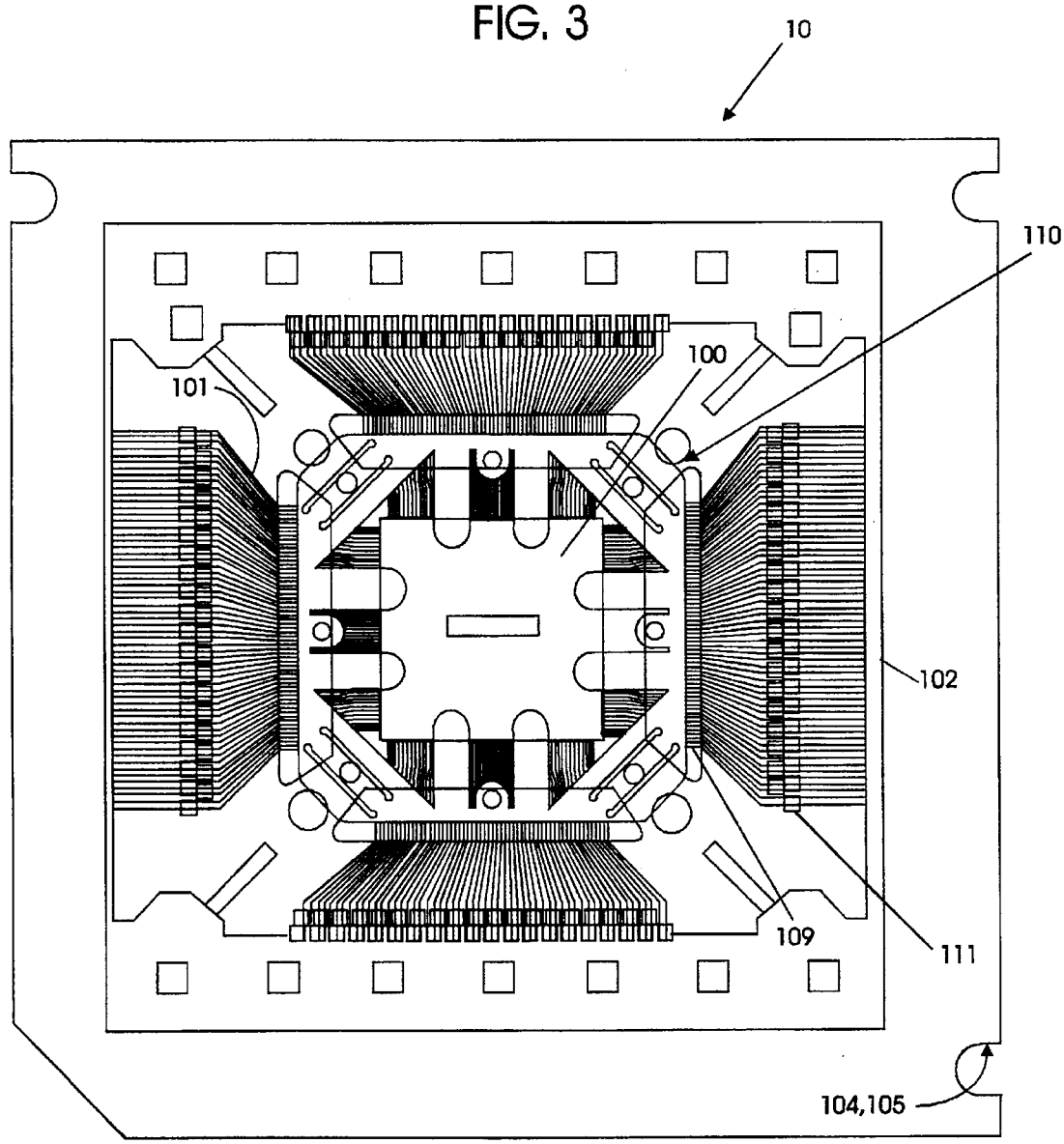
FIG. 3 illustrates a top view of a preferred embodiment of the present invention with the die under test inserted.

FIG. 2 illustrates a top view of TAB-based carrier 10 without die 100 inserted, while FIG. 3 illustrates a top view of carrier 10 with die 100 inserted thereon utilizing spring clip 110.

Referring to FIGS. 1–3, polyimide TAB tape 102 having a plurality of TAB conductors 101 is mounted in a TAB slide carrier (available from Camtex, No. 501-001) having top 104 and bottom 105 portions. The TAB tape 102 is attached to the backing plate 106 using a non-conducting adhesive. A commercially available silicone adhesive may be used. TAB tape 102 is well-known in the art. A unique aspect of the present invention is that the TAB tape ILB fingers 109 are bent upwards at an angle (e.g., 30°–65°). The result of the upward bending of fingers 109 is that the ends of fingers 109 act to scrub contacts 400 on die 100 when die 100 is placed on top of fingers 109. This lateral scrubbing motion insures low contact resistance with an acceptably low contact force.

This lateral scrubbing motion of the ends of fingers 109 on contacts 400 is performed when die 100 is pressed downward towards pedestal 112. Fingers 109 before placement of die 100 project slightly higher than the top of pedestal 100. Thus, when die 100 is positioned downward towards pedestal 100, the ends of fingers 109 touch contacts 400, and during the continued motion of die 100 downward towards 112, fingers 109 are pressed downward causing the ends to move across the surfaces of contacts 400. As a result of these electrical contacts, electrical access to the integrated circuitry within die 100 is accessible to the plurality of TAB conductors 101 via JEDEC-specification (Joint Electron Device Engineering Council, which is one of the various bodies and committees that determine the standards on behalf of the U.S.A. Standards Institute) test pads 111. This electrical access is utilized for the FST and B/I.

Backfill 107 is utilized underneath the bent up fingers 109 to provide a spring action to fingers 109. This elastomeric underfill 107 allows fingers 109 to return to their original position after each IC insertion and removal to allow for multiple uses from one tape frame. Backfill 107 may be comprised of a silicone adhesive bead. Backing plate 106 with pedestal 112 formed therein may be plastic for low power testing or aluminum for high power testing. Pedestal 112 assists in controlling chip "overdrive" against contacts 400 and the ends of fingers 109. In other words, pedestal 112 provides a positive die stop during IC insertion in order to avoid overdriving the IC onto fingers 109. Spring clip 110 may be utilized to retain die 100 in contact with fingers 109 for transport between test equipment and assembly equipment. The spring clips 110 used may be etched stainless steel, fabricated using art work designed by and provided by the inventors. The fabrication technique is a standard industry practice. Optionally, thermal grease 108 may be interspersed between pedestal 112 and chip 100.

Hole 103 in spring clip 110 provides for bonder head access and supplementary contact pressure or thermal management.

Aluminum or a similar material may be adhesively bonded to the TAB tape backing to achieve rigidity of tab conductors 101. Alternatively, IC device 100 can be contained within the test socket by temporarily bonding IC 100 to pedestal 112 using a reworkable adhesive, thus eliminating the need for IC retention clip 110.

TAB tape test pads 111 may be fabricated to be compatible with JEDEC test pad standards in order to utilize existing FST and B/I sockets already commercially available.

Furthermore, fabrication of TAB tape 102 may be performed to be compatible with existing slide carriers for easy insertion into TAB tape test sockets in handling equipment. TAB tape 102 and associated sockets, etc. have been standardized through the JEDEC industry standard setting body. This means that by designing the TAB tape carrier per JEDEC guidelines, compatibility with a wide range of commercially available hardware (sockets, slide carriers, handling equipment, testing equipment, etc.) is assured.

TAB tape 102 may be procured in bare copper form and then plated with nickel or other suitable material for burn-in use. Plating of TAB tape conductors 101 with nickel (or other suitable metal) can be accomplished using standard electroplating or electroless plating techniques. These metal plating methods are standard practice in the fabrication of TAB tape 102.

A small anvil set may be utilized to perform the bending of fingers 109. The anvil set used to bend the leads may be fabricated by those skilled in the art per a design by the inventors.

Figure 5:
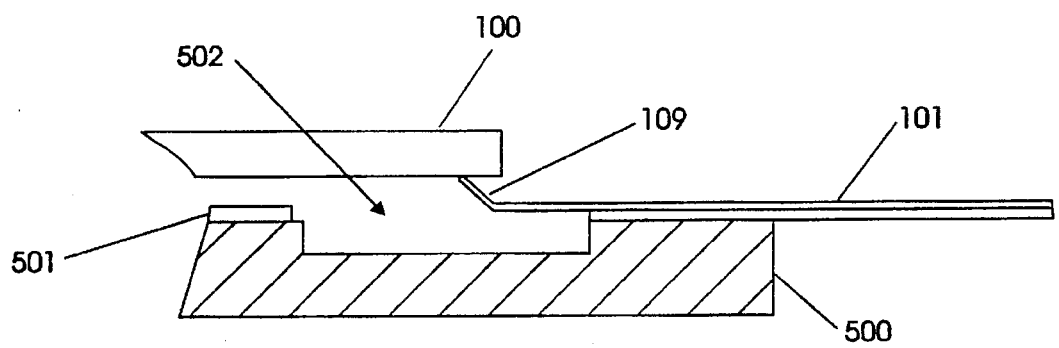
FIG. 5 illustrates a partial side sectional view of an alternative embodiment of the present invention before insertion of a die under test.
Figure 6:
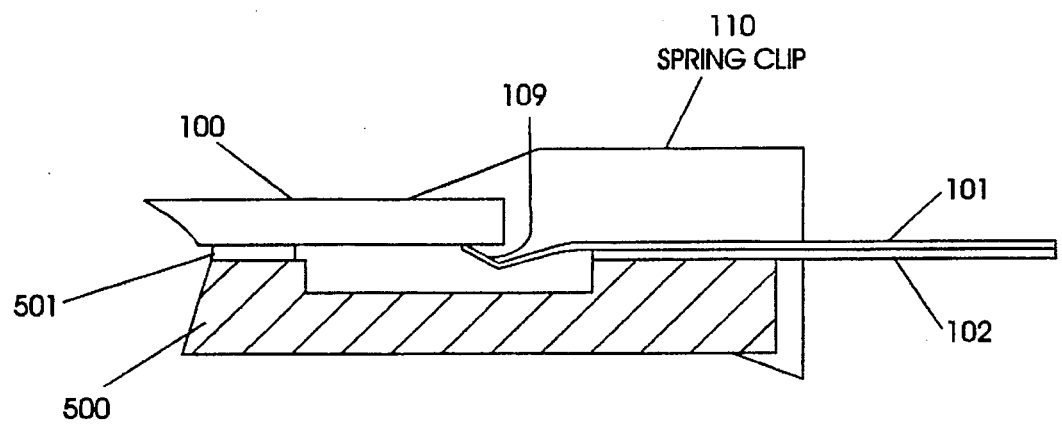
FIG. 6 illustrates a partial side sectional view of an alternative embodiment of the present invention after insertion of the die under test.

Referring next to FIG. 5, there is illustrated a partial side sectional view of an alternative embodiment of the present invention. In this configuration, backing plate 106 with pedestal 112 is replaced by pedestal 500 (made of aluminum or plastic) having cavity 502 formed therein. The main difference between the carrier illustrated in FIGS. 1–3 and that illustrated in FIGS. 5–6 is that backfill 107 is not required. Instead, conductors 101 and fingers 109 are plated with nickel over their copper composition so that they are more rigid. Thus, as shown in FIG. 6, when the die under test 100 is inserted thereon, fingers 109 are forced downward, bending the proximal portion of conductors 101 coupled to fingers 109. Because of the nickel plating, conductors 101 and fingers 109 are spring-like themselves, thus providing the necessary force for the ends of fingers 109 to scrub contact pads 400 underneath die 100. A 0.002 inch thick polyimide layer 501 is utilized to place die 100 thereon Fingers 109 are forced down into cavity 502.

Therefore, because of the nickel plating of conductors 101 and fingers 109, backfill 107 is not required to provide that spring action to fingers 109 as needed with the embodiment illustrated in FIGS. 1–3.

Although the present invention and its advantages have been described in detail, it should be understood that various changes, substitutions and alterations can be made herein without departing from the spirit and scope of the invention as defined by the appended claims.

What is claimed is:

1. An apparatus adaptable for testing or performing a burn-in of a chip die, said apparatus comprising:

TAB tape having a plurality of conductors ending in a plurality of inner lead bonding ("ILB") fingers, wherein said ILB fingers are bent at an angle from remaining portions of said TAB tape; and means adaptable for mounting said chip die on said apparatus so that contact pads on said chip die physically contact ends of said ILB fingers, said contact end of each said bent finger producing a spring force against a corresponding one of said pads.

2. The apparatus as recited in claim 1, further comprising backfill positioned underneath said ILB fingers.

3. The apparatus as recited in claim 1, wherein said angle is between 30 and 65 degrees.

4. The apparatus as recited in claim 1, further comprising a means for retaining said mounting of said chip die on said apparatus.

5. The apparatus as recited in claim 1, wherein a second angle of said ILB fingers from said remaining portions of said TAB tape subsequent to said mounting of said chip die on said apparatus is less than said angle.

6. The apparatus as recited in claim 5, wherein said ILB fingers perform a scrubbing action on said contact pads during said mounting of said chip die on said apparatus.

7. The apparatus as recited in claim 1, wherein portions of said ILB fingers proximal to said plurality of conductors are positioned at an angle downwards from a plane of said TAB tape while ends of said ILB fingers distal from said plurality of conductors are positioned at an angle upwards from said plane of said TAB tape.

8. The apparatus as recited in claim 7, wherein said plurality of conductors and said ILB fingers are nickel plated.

9. A method of preparing a chip die for testing or burn-in, said method comprising the steps of:

providing a TAB tape based carrier adaptable for mounting of said chip die thereon, said TAB tape based carrier including TAB tape having a plurality of conductors and a plurality of ILB fingers bent relative to remaining portions of said TAB tape so that ends of said ILB fingers project upwards from a plane of said TAB tape; and mounting said chip die on said TAB tape based carrier in a position and manner so that contact pads on an underside of said chip die physically contact said ends of said ILB fingers projecting upwards from said plane of said TAB tape, wherein said ends of said bent ILB fingers scrub a surface of said contact pads during said mounting step.

10. The method as recited in claim 9, further comprising the steps of:

controlling overdrive of said ends of said ILB fingers and said contact pads; and retaining said chip die in contact with said TAB tape based carrier.

11. An apparatus adaptable for fast speed testing or performing a burn-in of a chip die, said apparatus comprising:

TAB tape having a plurality of conductors ending in a plurality of ILB fingers bent at an angle from a plane containing remaining portions of said TAB tape, wherein said angle is between 30 and 65 degrees from said plane;

a TAB slide carrier for mounting said TAB tape;

elastomeric silicone backfill positioned underneath said ILB fingers;

JEDEC-specification test pads coupled to said plurality of conductors;

a pedestal adaptable for mounting said chip die thereon so that contact pads on said chip die physically contact ends of said bent ILB fingers, said pedestal controlling overdrive of said ends of said ILB fingers and said contact pads;

a spring clip for retaining said mounting of said chip die on said apparatus; and thermal grease spread between said chip die and said pedestal.

12. The apparatus as recited in claim 1, wherein tips of said ends of said ILB figures contact said contact pads on said chip die.

13. The apparatus as recited in claim 1, wherein said ends of said ILB fingers are positioned so that they point into said contact pads on said chip die.

14. The apparatus as recited in claim 1, wherein said ends of said ILB fingers contacting said contact pads on said chip die are substantially straight.

15. An apparatus comprising:

TAB tape having a plurality of conductors ending in a plurality of inner lead bonding ("ILB") fingers, wherein said ILB fingers are bent at an angle from remaining portions of said TAB tape; and means adaptable for mounting said chip die on said apparatus so that contact pads on said chip die physically contact ends of said bent ILB fingers.

* * * * *

UNITED STATES PATENT AND TRADEMARK OFFICE
CERTIFICATE OF CORRECTION

PATENT NO. : 5,656,941
DATED : August 12, 1997
INVENTOR(S) : Thomas Alan Bishop et al.

It is certified that error appears in the above-indentified patent and that said Letters Patent is hereby corrected as shown below:

On title page, item [73], add the following:
--Assignee: Microelectronics and Computer Technology Corporation, Austin, Texas--.

Signed and Sealed this

Twenty-fourth Day of March, 1998

Attest:

BRUCE LEHMAN

Attesting Officer     Commissioner of Patents and Trademarks